(12) United States Patent
Li et al.

(10) Patent No.: US 9,132,973 B2
(45) Date of Patent: Sep. 15, 2015

(54) CARTRIDGE FOR CARRYING GLASS SUBSTRATE

(75) Inventors: Xiande Li, Guandong (CN); Chun Hao Wu, Guandong (CN); Kun Hsien Lin, Guandong (CN); Minghu Qi, Guandong (CN); Erqing Zhu, Guandong (CN); Weibing Yang, Guandong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 690 days.

(21) Appl. No.: 13/510,370

(22) PCT Filed: Apr. 12, 2012

(86) PCT No.: PCT/CN2012/073860
§ 371 (c)(1),
(2), (4) Date: May 17, 2012

(87) PCT Pub. No.: WO2013/143170
PCT Pub. Date: Oct. 3, 2013

(65) Prior Publication Data
US 2013/0256248 A1    Oct. 3, 2013

(51) Int. Cl.
*B65G 49/06*    (2006.01)
*H01L 21/673*    (2006.01)

(52) U.S. Cl.
CPC ............ *B65G 49/062* (2013.01); *B65G 49/061* (2013.01); *H01L 21/6734* (2013.01)

(58) Field of Classification Search
CPC .... B65D 85/48; H01L 21/6734; C03B 35/00; C03B 35/14; C03B 35/142; C03B 35/145; C03B 35/20; C03B 35/202; C03B 35/207; B65G 49/062; B65G 49/061
USPC ........................................................ 211/41.14
See application file for complete search history.

(56) References Cited

U.S. PATENT DOCUMENTS

| 873,496 | A | * | 12/1907 | Bryant | .......................... 211/188 |
| 2,944,676 | A | * | 7/1960 | Bell | ............................... 211/191 |
| 4,819,814 | A | * | 4/1989 | Fogelgren | ........................ 211/50 |
| 5,185,982 | A | * | 2/1993 | Hostetler | ........................ 52/646 |
| 5,531,464 | A | * | 7/1996 | Maurer et al. | ............. 280/47.35 |
| 5,584,401 | A | * | 12/1996 | Yoshida | ........................ 211/41.1 |
| 7,334,690 | B2 | * | 2/2008 | Huang et al. | ................ 211/41.18 |
| 2006/0005875 | A1 | * | 1/2006 | Haberlein | ...................... 136/251 |
| 2013/0008865 | A1 | * | 1/2013 | Su | ................................. 211/153 |

\* cited by examiner

*Primary Examiner* — Korie H Chan
(74) *Attorney, Agent, or Firm* — Andrew C. Cheng

(57) ABSTRACT

A cartridge for carrying glass substrate is provided, and the cartridge comprises a pair of side beams each is provided with at least two pillars along a first direction. Each of the pillars is configured with a plurality of fixtures detachably juxtaposed vertically. A plurality of supporting units is arranged between the fixtures of the side beams so as to define a plurality of supporting surfaces vertically. And a plurality of free locking units detachably are secured to the fixtures on the common surface so as to allow the moving of the fixtures on the common surface as a whole. With the provision of the cartridge of the present invention, the damaged glass substrate can be conveniently and effectively removed without tempering other glass substrates which are intact and undamaged.

16 Claims, 14 Drawing Sheets

101

101

CARTRIDGE FOR CARRYING GLASS SUBSTRATE

The present invention relates to a technology of liquid crystal display, and more particularly to a cartridge used to carry a plurality of glass substrates.

BACKGROUND OF THE INVENTION

In the existing technology of making a liquid crystal display, a glass substrate has to be transferred from a cartridge, on which a plurality of glass substrates are juxtaposed or piled up, to a production line in which a plurality of different processes are performed on the glass substrate so as to complete a panel. In general, totally about fifty-six (56) sheets of glass substrates are stacked within the cartridge, and every two adjacent glass substrates (top and below) are spaced about twenty-one (21) mm. However, the thickness of the glass substrate is merely about 0.4 to 0.7 mm, and it is very brittle to crack. As a result, a check up process has to be performed during the transferring of the glass substrate onto the production line.

Currently, the cartridge used is featured a one-piece structure, and once a damage or defective is found on the glass substrate during transferring, the cartridge has to be moved onto a carrier manually. Then, an evaluation will be conducted so as to determine how to best utilize the glass substrate based on the position of the damage or defective. In general, a small recycle tray is placed onto a PV board, and then a scissor is used to cut the glass substrate into a plurality of small pieces for other applications. Then, those small sized glass substrates are collected into the recycle tray. Then, a glass substrate under the damaged glass substrate is exposed, and will be vacuumed and wiped with dust-free cloth so as to make sure there is no debris left over. The recycle tray is then moved to a bigger recycle box in which all the small sized glass substrate are stocked.

An extensive laborious works have to be involved, and in addition, it takes a lot of time. On the other hand, when the damaged or defective glass substrate is cut with scissor, the other glass substrate can be readily damaged, creating unnecessary second damages to the glass substrate.

It is therefore a necessity to provide a pickup device for transferring the glass substrate so as to resolve the current issues.

SUMMARY OF THE INVENTION

The technology provided by the present invention is to introduce a cartridge for glass substrate which can be readily and conveniently assembled. In addition, in case of damaged glass substrate is encountered, it can be readily and effectively removed so as to reduce the labor and time consumed.

In order to resolve the prior art issue, a cartridge for carrying glass substrate is provided, and the cartridge comprises a pair of side beams each is provided with at least two pillars along a first direction. Each of the pillars is configured with a plurality of fixtures detachably juxtaposed vertically. A plurality of supporting units is arranged between the fixtures of the side beams so as to define a plurality of supporting surfaces vertically. And a plurality of free locking units detachably are secured to the fixtures on the common surface so as to allow the moving of the fixtures on the common surface as a whole.

Wherein the fixture includes a main body, and a first extension extending along the vertical direction from the main body, and a pair of second extensions extending along the vertical direction from the main body, wherein the second extensions are spaced from each other and define a slot therebetween, and are opposite to the first extension, wherein the first extension of an upper fixture can readily and securely retained in the slot defined by two second extensions of a lower fixture.

Wherein the main bodies of the fixtures are defined with mounting holes for securing the supporting units.

According to one preferred embodiment of the invention, wherein the fixtures further includes a third extension extending along a direction perpendicular to the first horizontal direction and vertical direction from the main body outwardly from the cartridge, the free locking unit includes a first free locking device provided with a plurality of first slots which are matched and articulated with the third extensions of the first, second, third and fourth fixtures of the side beam.

According to one preferred embodiment of the invention, wherein the third extension has a hook-shaped configuration.

According to one preferred embodiment of the invention, wherein the hook-shaped configuration of the fixtures located adjacent to a center of the side beam are opposite to each other.

According to one preferred embodiment of the invention, wherein the fixtures located on the ends of the side beam include a fourth extension extends along the first horizontal direction and out of the cartridge from the main body, the free locking unit further includes a second free locking device is provided with a pair of second slot along the longitudinal direction which are interlocked with the fourth extensions fixtures located on the ends of the side beam.

According to one preferred embodiment of the invention, wherein the fourth extension is defined with a first mounting hole, and the second free locking device is defined with a second mounting hole aligned with the first mounting hole of the fourth extension.

According to one preferred embodiment of the invention, wherein the cartridge further includes at least an enhancing device securely and vertically attached to two adjacent fixtures located on upper and lower supporting surfaces.

According to one preferred embodiment of the invention, wherein the enhancing device is configured with a main truss, a plurality of first extensions extending vertically from the main truss and second extensions opposite to the first extension and extending vertically from the main truss, accordingly, the first extensions of the fixtures can securely inserted between the second extensions of the main truss of the enhancing device.

According to one preferred embodiment of the invention, wherein the enhancing device further includes a reinforced bar spanned and bridged between the enhancing devices of the pair of side beams so as to increase the stability of the cartridge of the glass substrate along the first horizontal directions, and the second direction.

According to one preferred embodiment of the invention, wherein the first extension is provided with a first mounting hole, and the second extension is provided with a second mounting hole, when the first extension of an upper fixture is juxtaposed with the second extension of the lower fixture, the first mounting hole and the second mounting hole are aligned with each other, the first extension of the enhancing device is provided with a third mounting hole, and the second extension of the enhancing device is provided with a fourth mounting hole, when the first extension of the fixture is interlinked with the second extension of the enhancing device, the first mounting hole is aligned with the fourth mounting hole, when the second extension of the fixture is interlinked with the first extension of the enhancing device, the second mounting hole is aligned with the third mounting hole.

In order to resolve the prior art issue, a cartridge for carrying glass substrate is provided, and the cartridge comprises a pair of first and second side beams arranged opposite to each other. Each of the first and second side beams is provided with at least a pair of first and second pillars which is configured by detachably and vertically stacking of a plurality of fixtures. Each of the fixtures defines with mounting hole. A plurality of supporting units each is attached to two adjacent fixtures of the first and second side beams so as to define a plurality of supporting surfaces. And at least a free locking device is detachably secured to the fixtures of a common supporting surface such that the fixtures located on a common place can be moved as a whole.

According to one preferred embodiment of the invention, wherein the fixture includes a main body, and a first extension extending along the vertical direction from the main body, and a pair of second extensions extending along the vertical direction from the main body, wherein the second extensions are spaced from each other and define a slot therebetween, and are opposite to the first extension, wherein the first extension of an upper fixture can readily and securely retained in the slot defined by two second extensions of a lower fixture.

According to one preferred embodiment of the invention, wherein the fixtures further includes a third extension extending along a direction perpendicular to the first horizontal direction and vertical direction from the main body outwardly from the cartridge, the free locking unit includes a first free locking device provided with a plurality of first slots which are matched and articulated with the third extensions of the first, second, third and fourth fixtures of the side beam.

According to one preferred embodiment of the invention, wherein the third extension has a hook-shaped configuration.

In order to resolve the prior art issue, a cartridge for carrying glass substrate is provided, and the cartridge comprises a pair of first and second side beams arranged opposite to each other. Each of the first and second side beams is provided with at least a pair of first and second pillars which is configured by detachably and vertically stacking of a plurality of fixtures. A plurality of supporting units each is attached to two adjacent fixtures of the first and second side beams so as to define a plurality of supporting surfaces. A free locking device is detachably secured to the fixtures located on a common supporting surface so as to allow moving the fixtures as a whole. And at least an enhancing device is detachably secured to two adjacent fixtures vertically arranged on two adjacent supporting surfaces.

According to one preferred embodiment of the invention, wherein the fixture includes a main body, and a first extension extending along the vertical direction from the main body, and a pair of second extensions extending along the vertical direction from the main body, wherein the second extensions are spaced from each other and define a slot therebetween, and are opposite to the first extension, wherein the first extension of an upper fixture can readily and securely retained in the slot defined by two second extensions of a lower fixture.

According to one preferred embodiment of the invention, wherein each of the fixtures is defined with a mounting hole to support the supporting unit.

According to one preferred embodiment of the invention, wherein the fixtures further includes a third extension extending along a direction perpendicular to the first horizontal direction and vertical direction from the main body outwardly from the cartridge, the free locking unit includes a first free locking device provided with a plurality of first slots which are matched and articulated with the third extensions of the first, second, third and fourth fixtures of the side beam.

The advantages of the present invention is that as it can be readily differentiated from the prior art for the cartridge introduced by the present invention can readily remove the damaged glass substrate without tempering those glass substrates intactly disposed on upper and under the damaged glass substrate.

BRIEF DESCRIPTION OF PREFERRED EMBODIMENT

In order to better understand the preferred embodiments disclosed by the present invention, drawing Figures are provided for illustrations and description. While it is obvious that any skilled in the art can readily get other modifications based on these Figures as which are merely some preferred embodiments of the present invention. Wherein FIG. 1 is a simplified perspective view of a cartridge made in accordance with the present invention;

DETAILED DESCRIPTION OF PREFERRED EMBODIMENT

A brief and detailed description will be given in view of the attached drawing Figures.

Figure 1:
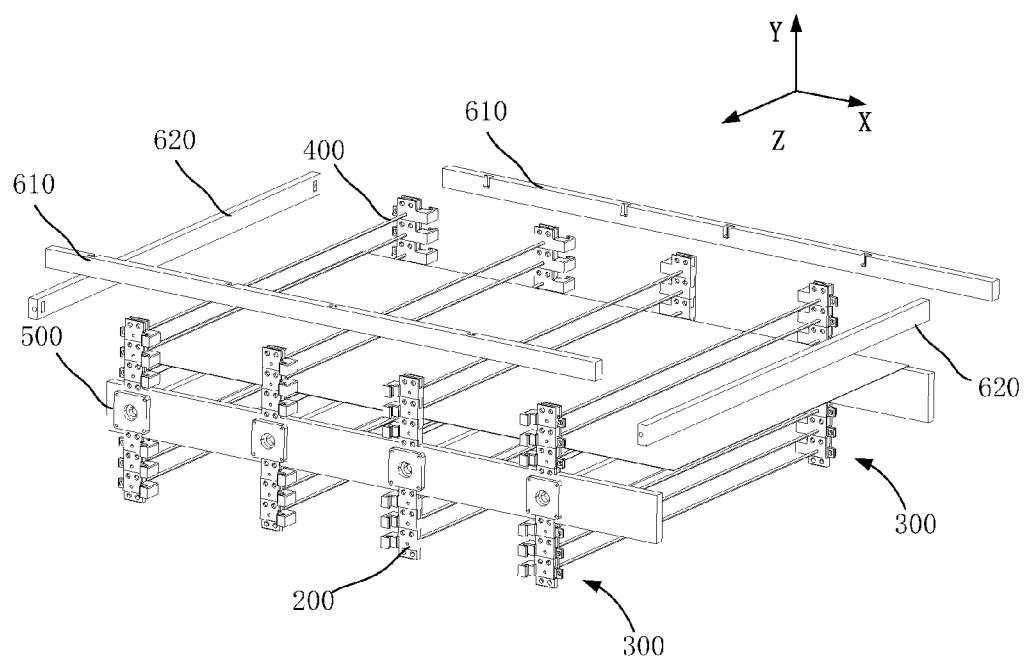
Figure 2:
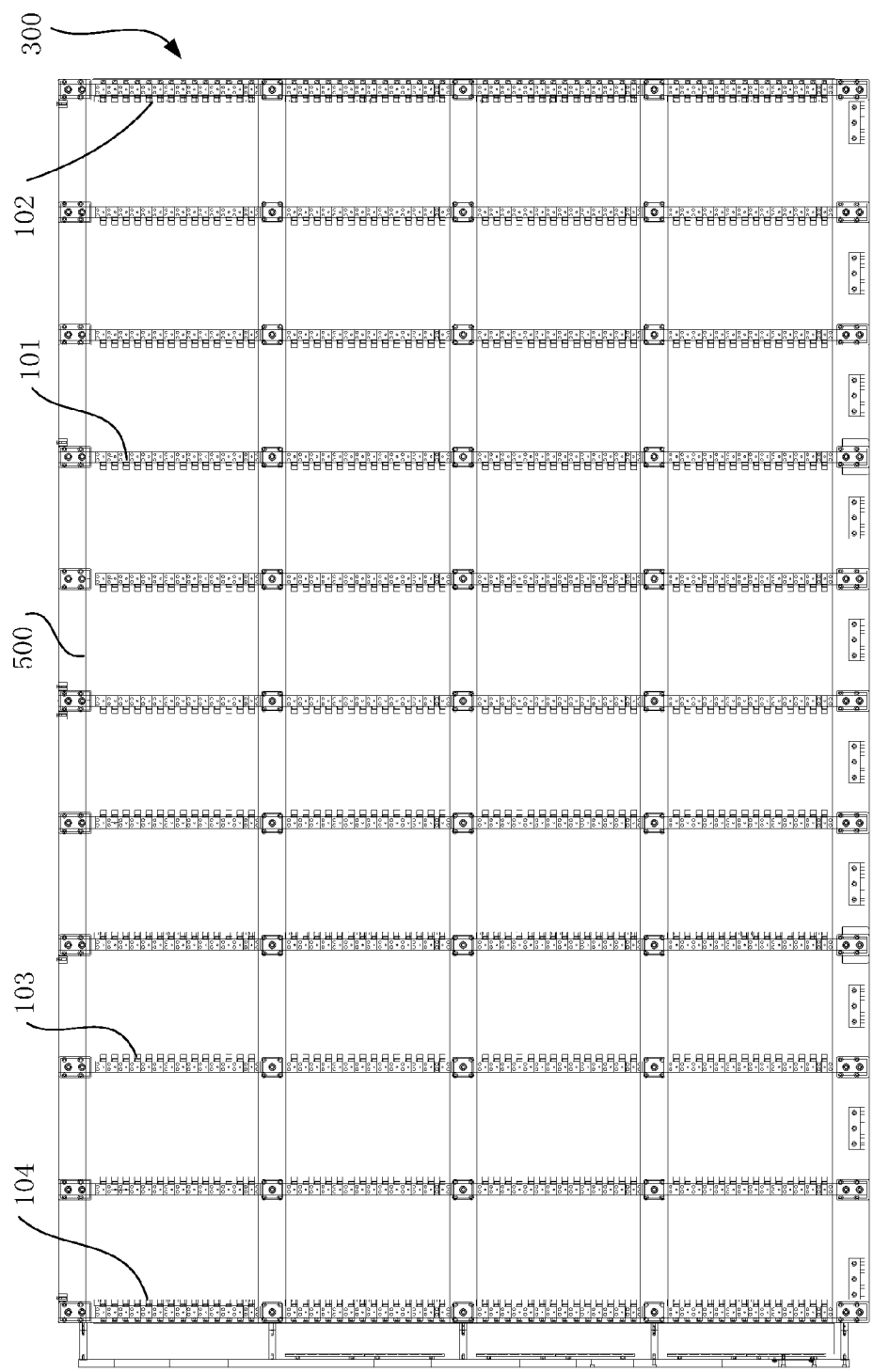
FIG. 2 is a side elevational view of the cartridge shown in FIG. 1.
Figure 3:
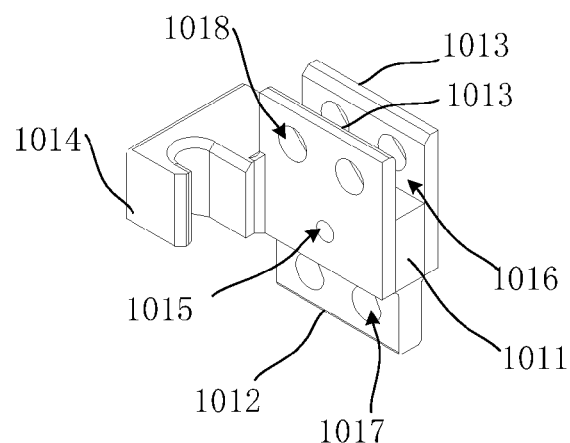
FIG. 3 is a perspective view of a first embodiment of a fixture used in the cartridge.
Figure 4:
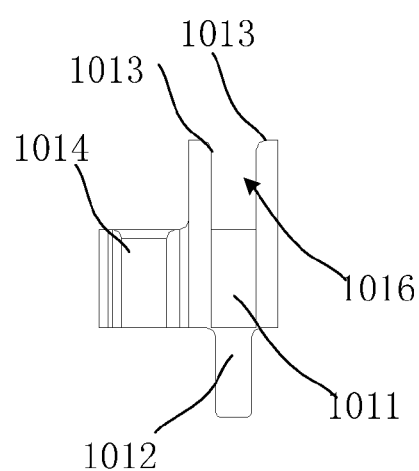
FIG. 4 is a front view of the fixture shown in FIG. 3.
Figure 5:
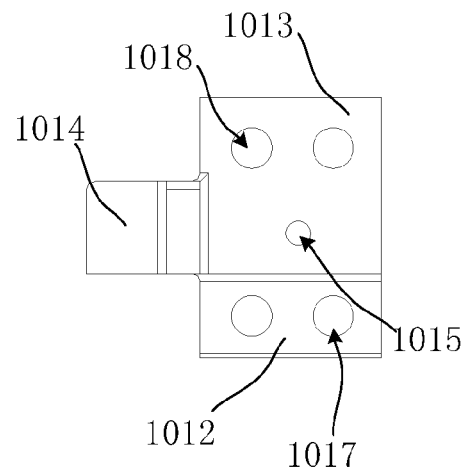
FIG. 5 is a left side elevational view of the fixture shown in FIG. 3.
Figure 6:
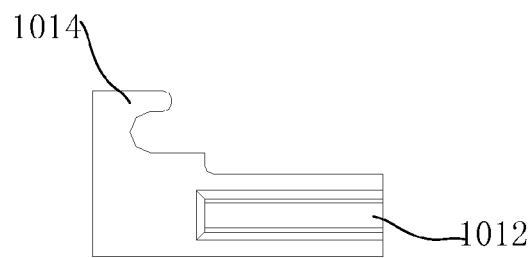
FIG. 6 is a bottom view of the fixture shown in FIG. 3.
Figure 7:
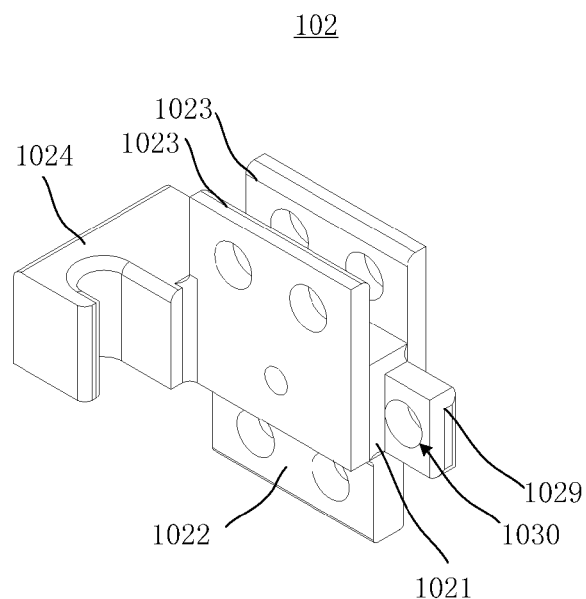
FIG. 7 is a perspective view of a second embodiment of a fixture used in the cartridge.
Figure 8:
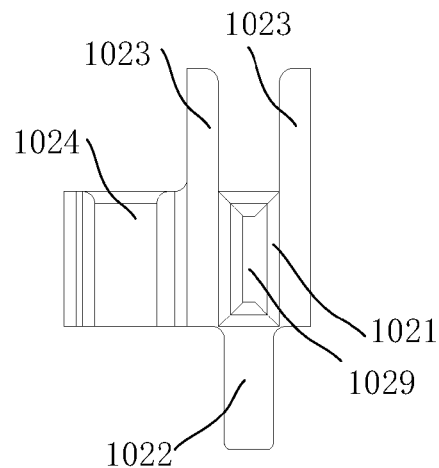
FIG. 8 is a front view of the fixture shown in FIG. 7.
Figure 9:
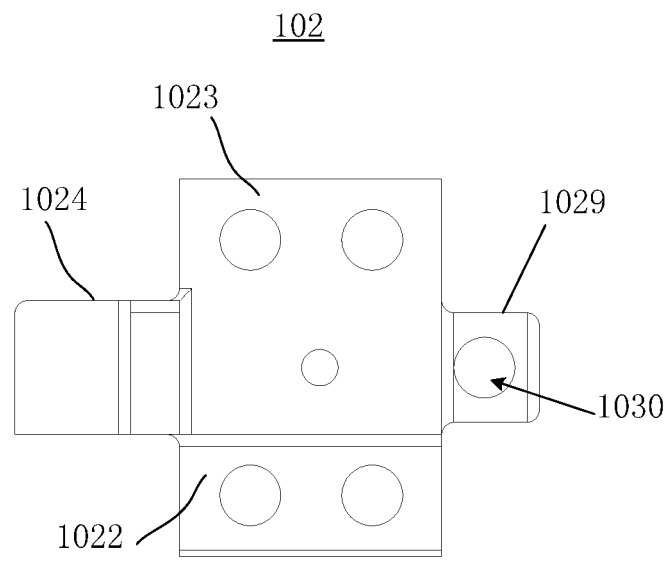
FIG. 9 is a left side elevational view of the fixture shown in FIG. 7.
Figure 10:
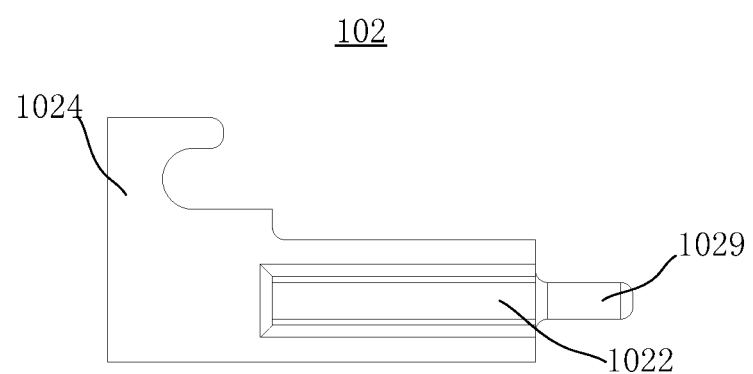
FIG. 10 is a bottom view of the fixture shown in FIG. 7.
Figure 11:
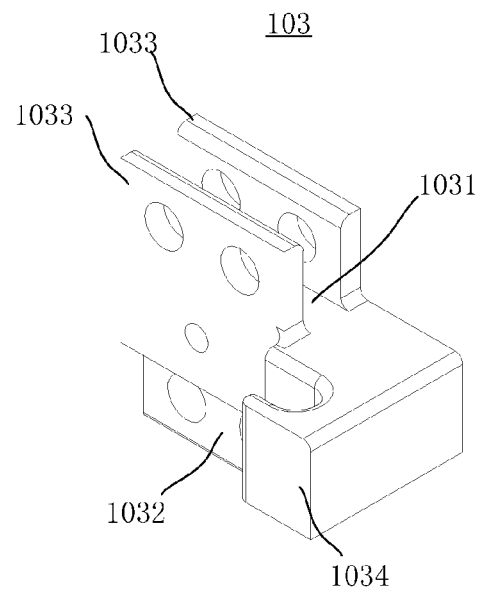
FIG. 11 is a perspective view of a third embodiment of a fixture used in the cartridge.
Figure 12:
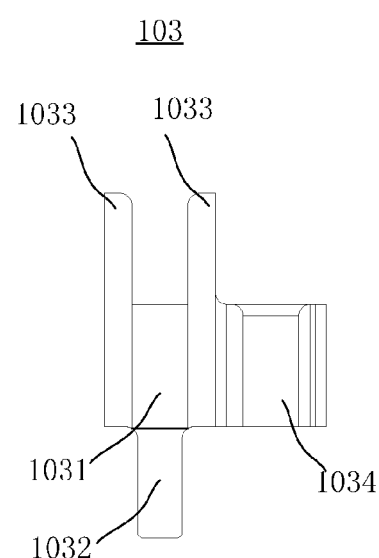
FIG. 12 is a front view of the fixture shown in FIG. 11.
Figure 13:
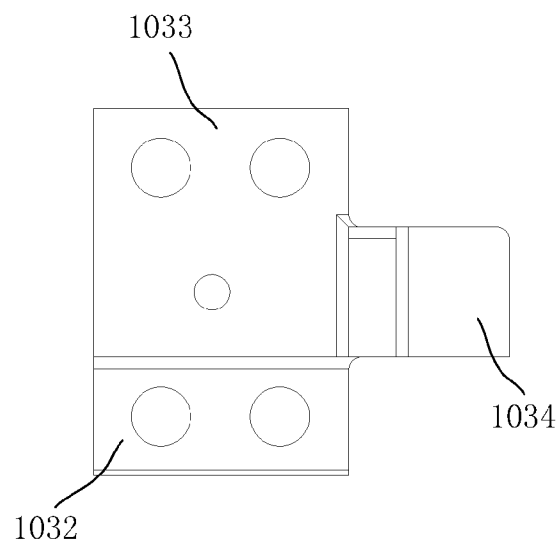
FIG. 13 is a left side elevational view of the fixture shown in FIG. 11.
Figure 14:
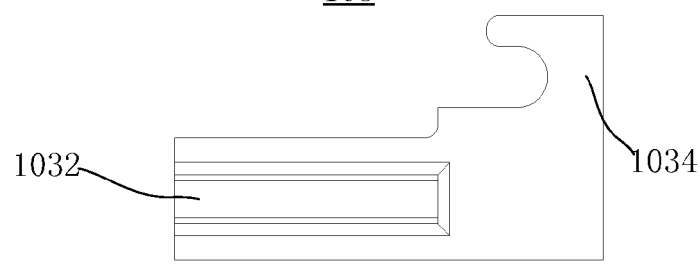
FIG. 14 is a bottom view of the fixture shown in FIG. 11.
Figure 15:
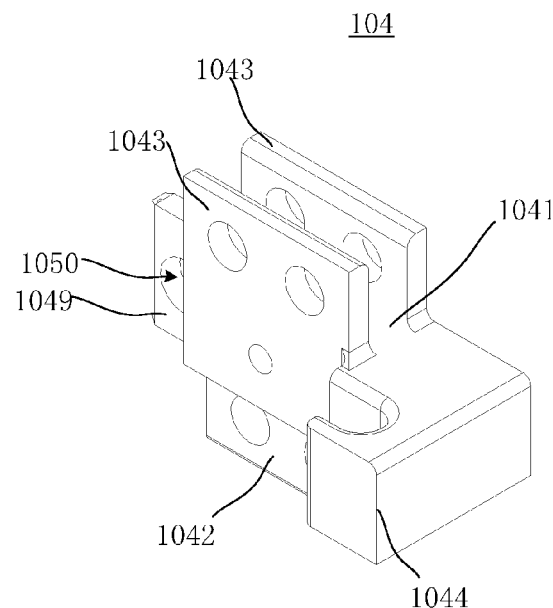
FIG. 15 is a perspective view of a fourth embodiment of a fixture used in the cartridge.
Figure 16:
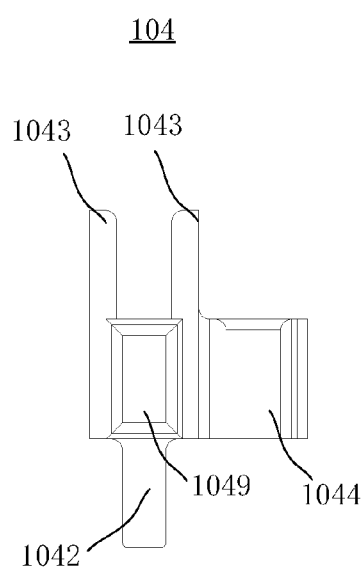
FIG. 16 is a front view of the fixture shown in FIG. 15.
Figure 17:
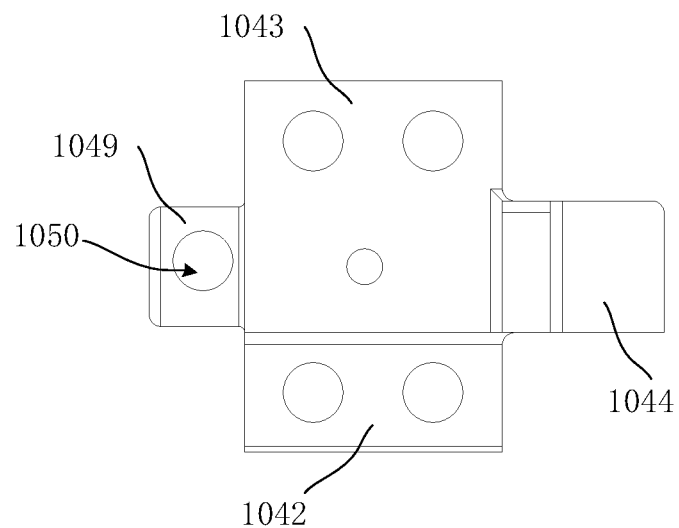
FIG. 17 is a left side elevational view of the fixture shown in FIG. 15.
Figure 18:
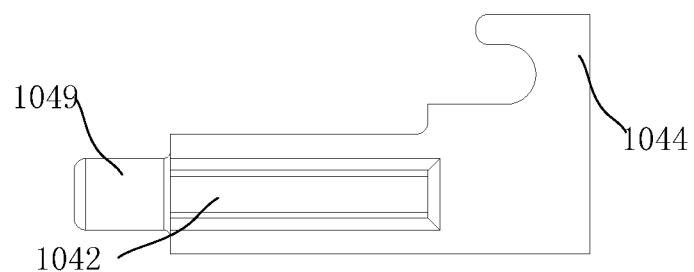
FIG. 18 is a bottom view of the fixture shown in FIG. 15.

Referring to FIG. 1-2, a cartridge for carrying glass substrate in accordance with a preferred embodiment of the present invention comprise a pair of side beam 300, a plurality supporting units 400, at least an enhancing device 500, and a pair of first self-locking device 610, and a pair of second self-locking device 620.

The side beam 300 further includes at least a pair of pillars 200 along a longitudinal or horizontal direction. Each of the pillars 200 is configured by stacking a plurality of first, second, third or four fixtures 101, 102, 103, and 104 interlocked with each other along a vertical direction.

The supporting units 400 is used to bridge two opposite first, second, third or four fixtures 101, 102, 103, and 104 such that a plurality stories of supporting surface is provided along the vertical direction Y. Since each of the first, second, third or four fixtures 101, 102, 103 and 104 has a certain or preset height, therefore the supporting surface are spaced from each other, and the glass substrate can be disposed onto the supporting surface jointly defined by the supporting units 400. As a result, each supporting surface horizontally defined by the supporting units 400 can be used to store a glass substrate. In the preferred embodiment, the supporting units 400 are configured by metal wires or cable.

The enhancing device 500 interlinks every two adjacent first, second, third or four fixtures 101, 102, 103 and 104 along the vertical direction. The enhancing device 500 is used to enhance the stability of the side beam 300 along the first horizontal direction X. Of course, the side beam 300 can be incorporated with a plurality of enhancing devices 500 so as to enhance its stability. In addition, every two adjacent enhancing devices 500 can be arranged with multiple supporting surfaces.

Since the pillars 200 of the side beams 300 are configured by interlocking a plurality of first, second, third or four fixtures 101, 102, 103 or 104, as a result, a plurality of supporting surfaces are defined for carrying a plurality of glass substrates over each of the supporting surfaces. As started from the upper layer along the vertical direction Y, i.e. starting from the first, second, third or four fixtures 101, 102, 103 or 104, every certain number of the supporting surfaces can be grouped as an unit, every two adjacent units are interlinked with the enhancing devices 500 on the adjacent first, second, third or four fixtures 101, 102, 103 or 104. Accordingly, the stability of the side beams 300 can be effectively enhanced by the inclusion of a preset number of the enhancing device 500.

The first free locking device 610 and the second free locking device 620 can be detachably interlinked to the first, second, third or four fixtures 101, 102, 103 or 104 located on a common supporting plane. Such that the fixtures 101, 102, 103 or 104 on the same supporting surface can be readily moved over.

Detailed description of the first, second, third or four fixtures 101, 102, 103 or 104, in view of their structure and configuration, as well as its operation, along with the supporting units 400, the enhancing device 500, including its configuration as well as it interlinking arrangement and the first free locking device 610 and the second free locking device 620 will be given herebelow.

In this preferred embodiment, the first, second, third or four fixtures 101, 102, 103 or 104, which are used to configure the pillars 200 are different in its configuration, as shown in FIGS. 3 to 6. The fixture 101 shown in FIG. 2 is located and attached to a right position next to central point. As shown in FIGS. 3 to 6, the fixture 101 includes a main body 1011, a first extension 1012, a second extension 1013, and a third extension 1014.

In this embodiment, the body 1011 of the first fixture 101 is rectangular, and defined with a mounting hole 1015 for securing the supporting unit 400. When a metal wire is used for the supporting unit 400, ends of the metal wires can be securely attached to a common plane of the fixtures 101 of the side beam by means of a threaded anchor (not shown) and the mounting hole 1015.

The first extension 1012 of the first fixture 101 has a rectangular shape, and extends along the vertical direction Y from the main body 1011. The pair of second extensions 1013 are also rectangular shape, and extend along the vertical direction Y from the main body 1011. The second extensions 1013 are spaced from each other and define a slot 1016 therebetween. The second extensions 1013 are opposite to the first extension 1012. By this arrangement, the first extension 1012 of an upper fixture 101 can readily and securely retained in the slot 1016 defined by two second extensions 1013 of a lower fixture 101. The first extension 1012 is defined with a first mounting hole 1017, and the second extensions 1013 are also defined with second mounting holes 1018. When the first extension 1012 of the upper fixture 101 is securely seated between the slot 1016 of the second extensions 1013 of the lower fixture 101, the first mounting hole 1017 and the second mounting holes 1018 are aligned with each other. Accordingly, a bolt (not shown in Figure) can be incorporated so as to secure the upper and lower fixtures 101. Of course, other arrangement of securing can also be applied so as to securely position the upper and lower fixtures 101, for example, an interference fit can be applied.

The third extension 1014 extends along a direction Z which is perpendicular to the first horizontal direction X and vertical direction Y, i.e. it extends from the main body 1011 outwardly from the cartridge. In this embodiment, the first extension 1014 has a hook-shaped configuration.

Referring to FIGS. 7-10, the fixture 102 is located on a right side of the side beam 300 shown in FIG. 2. As shown in FIGS. 7-10, the second fixture 102 is configured with a main body 1021, a first extension 1022, a pair of second extensions 1023, and a third extension 1024, and a fourth extension 1029.

The main body 1021, the first extension 1022, the second extensions 1023, the third extension 1024, and the extension 1029 of the second fixture 102 are identical to the main body 1011, the first extension 1012, the second extension 1013, and the third extension 1014 of the first fixture 101. Accordingly, no detailed description is given here.

The difference between the first and second fixtures 101 and 102 is that the second fixture 102 further includes a fourth extension 1029. The fourth extension 1029 extends along the first horizontal direction X, i.e. extends out of the cartridge from the main body 1021. The fourth extension 1029 is defined with a fourth mounting hole 1030.

Referring to FIGS. 11-14, the third fixture 103 is located on a left next to a center of the side beam 300 shown in FIG. 2. As shown in FIGS. 11-14, the third fixture 103 is configured with a main body 1031, a first extension 1032, a pair of second extensions 1033, and a third extension 1034.

The main body 1031, the first extension 1032, the second extensions 1033, of the third fixture 103 are identical to the main body 1011, the first extension 1012, the second extension 1013 of the first fixture 101 shown in FIGS. 3 to 6 Accordingly, no detailed description is given here.

The difference of the first and third fixtures 101 and 103 are located at the direction of the third extensions 1014 and 1034 of the first and third fixtures 101 and 103, i.e. they are opposite from each other.

Referring to FIGS. 15 to 18, the fourth fixture 104 are located at left end of the side beam 300 shown in FIG. 2. As shown, the fourth fixture 104 includes a main body 1041, a first extension 1042, a pair of second extension 1043, a third extension 1044, and a fourth extension 1049.

The main body 1041, the first extension 1042, the second extensions 1043, and the third fixture 103 of the fourth fixture 104 are identical to the main body 1031, the first extension 1032, the second extension 1033, and the third extension 1034 of the third fixture 103 shown in FIGS. 11 to 14. Accordingly, no detailed description is given here.

The difference between the fourth fixture 104 and the third fixture 103 is the fourth fixture 104 includes a fourth extension 1029, which extends from the first direction X from the main body 1041, and toward exterior side of the cartridge of the glass substrate. The fourth extension 1029 is defined with a fourth mounting hole 1050.

Referring to FIG. 2, in the preferred embodiment, the third extensions 1014, 1024 of the first and second fixtures 101 and 102 located adjacent to the center of the side beam 300 are arranged opposite to the third extensions 1034, 1044 of the third and fourth fixtures 103, 104.

Figure 19:
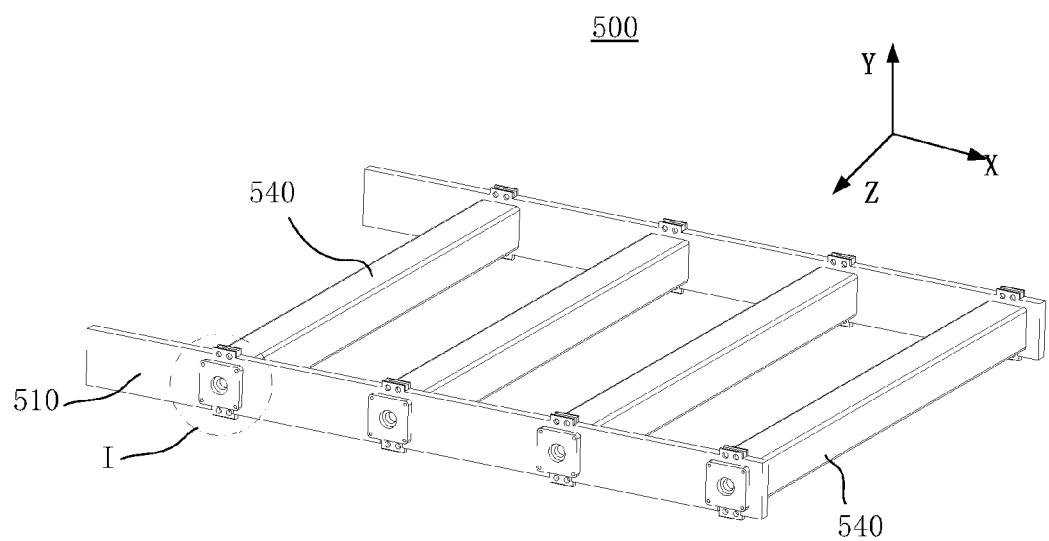
FIG. 19 is a perspective view of an embodiment of a locking device of the cartridge for glass substrate.
Figure 20:
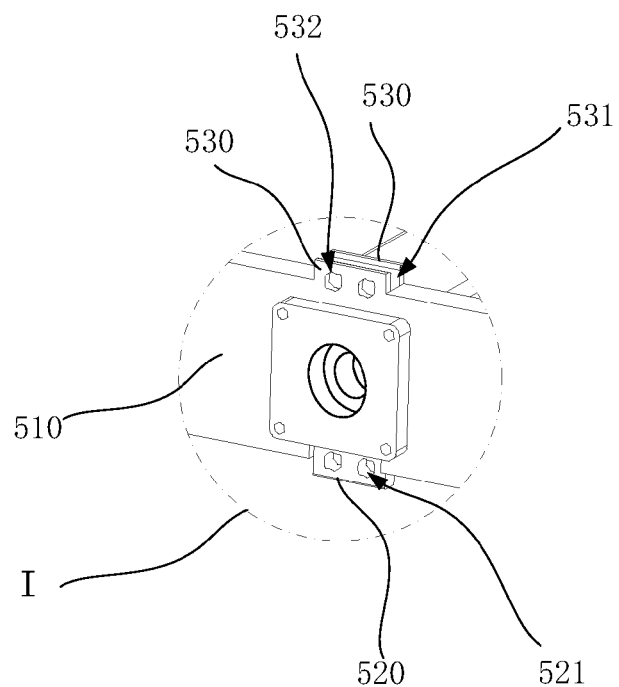
FIG. 20 is an enlarged view of the encircled portion I in FIG. 19.

Referring to FIGS. 19 and 20, the enhancing device 500 is configured with a main truss 510, a plurality of first extension 520 and second extension 530, and a reinforced bar 540.

The main truss 510 has an elongated configuration, and its length is dimensioned to identical to the width of the side beam 300 along the first horizontal direction X. The first extension 520 and second extension 530 are aligned with the first, second, third and fourth fixtures 101, 102, 103 or 104.

The first extension 520 has a rectangular shape, and extends from the main truss 510 along the vertical direction Y. The second extension 530 is also rectangular shape, and extends from the main truss 510 along the vertical direction Y. Every two second extensions 530 define a slot 531. The first extension 520 and the second extension 530 are oppositely arranged, accordingly, the first extensions 1012, 1022, 1032, or 1042 of the first, second, third or fourth fixtures 101, 102, 103 or 104 can securely inserted within the slot 531 defined between the second extensions 530 of the main truss 510 of the enhancing device 500. Meanwhile, the first extension 530 of the enhancing device 500 can be readily and securely seated between the pair of second extensions 1013, 1023, 1033 or 1043 of the first, second, third or fourth fixtures 101, 102, 103 or 104.

In this embodiment, the main truss 500, the first and second extensions 520 and 530 are integrally formed together, while it can be implemented as individual and separated parts, and then assembled together.

The first extension 520 of the enhancing device 500 is defined with a first mounting hole 521, and the second extension 530 is also defined with a second mounting hole 532. When the first extensions 1012, 1022, 1032 or 1042 of the first, second, third or fourth fixtures 101, 102, 103 or 104 are matched with the second extensions 530 of the enhancing device 500 along the vertical direction Y, the second mounting hole 532 of the second extension 530 will align with the mounting holes 1017 of the first extensions 1012, 1022, 1032 or 1042 of the first, second, third or fourth fixtures 101, 102, 103 or 104. When the second extensions 1013, 1023, 1033 or 1043 of the first, second, third or fourth fixtures 101, 102, 103 or 104 are matched with the first extensions 520 of the enhancing device 500 along the vertical direction Y, the first mounting hole 521 of the first extension 520 will align with the mounting holes 1018 of the first extensions 1013, 1023, 1033 or 1043 of the first, second, third or fourth fixtures 101, 102, 103 or 104. Then, with the application of a bolt and nut arrangement (not shown in Figures), the fixation of the first, second, third or fourth fixtures 101, 102, 103 or 104 along the vertical direction Y with respect to the enhancing device 500 can be readily done. Of course, in other preferred embodiment, other suitable fixation can be also implemented to secure the first, second, third or fourth fixtures 101, 102, 103 or 104 and the enhancing device 500, such as interference fit. As a result, no detailed description is given.

The reinforced bars 540 span and are bridged between the enhancing devices 500 of the pair of side beams 300. By this arrangement, the stability of the cartridge of the glass substrate along the first horizontal directions X, Y, and the second direction Z can be readily secured. Of course, as shown in FIG. 19, a plurality of reinforced bars 540 can be arranged along the first direction X so as to enhance the stability of the cartridge of the glass substrate.

Figure 21:
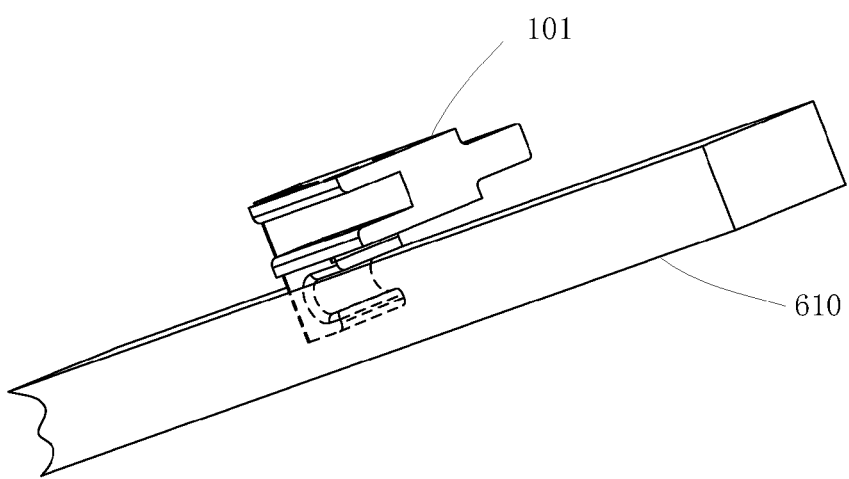
FIG. 21 is a perspective view illustrating the fixture is interlinked to the first self-locking device.
Figure 22:
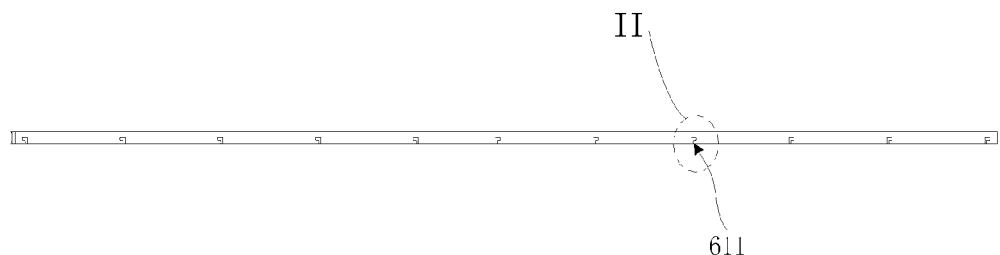
FIG. 22 is a bottom view of the self-locking device of the cartridge.
Figure 23:
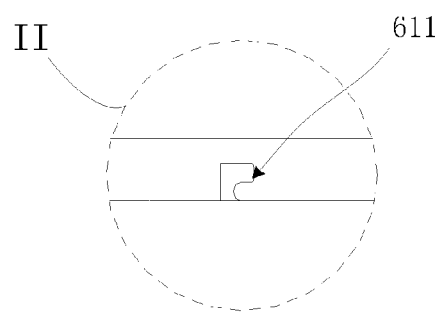
FIG. 23 is an enlarged view of the encircled portion II shown in FIG. 22.

Referring to FIGS. 21 to 23, the first free locking device 610 is detachably secured to the first, second, third and fourth fixtures 101, 102, 103, and 104 located on the same side of the side beam 300. As such, the first, second, third and fourth fixtures 101, 102, 103, and 104 can be moved as a whole.

The first free locking device 610 is provided with a plurality of first slots 611 which are matched and articulated with the third extensions 1014, 1024, 1034 or 1044 of the first, second, third and fourth fixtures 101, 102, 103, and 104 of the side beam 300. The first slots 611 are provided with structure which can interlock the third extensions 1014, 1024, 1034 or 1044 of the first, second, third and fourth fixtures 101, 102, 103, and 104 such that the first, second, third and fourth fixtures 101, 102, 103, and 104 can be securely arranged thereto. By this arrangement, the overall structure of the side beam 300 can be moved as a whole without worry about the falling off of the first, second, third and fourth fixtures 101, 102, 103, and 104.

Figure 24:
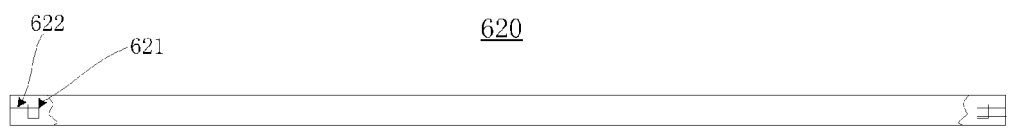
FIG. 24 is a top perspective view of a second self-locking device of the cartridge.
Figure 25:
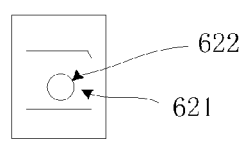
FIG. 25 is a side perspective view of a second self-locking device of the cartridge.

Referring to FIGS. 24 and 25, the second free locking device 620 is securely interlocked to the second and fourth fixtures 102, 104 which are located on the ends of the side beam 300. Accordingly, with the corporation of the first free locking device 620, the first, second, third and fourth fixtures 101, 102, 103, and 104 of both the side beams 300 on a common supporting plane can be moved together as a whole.

The second free locking device 620 is provided with a pair of second slot 621 along the longitudinal direction. The second slots 621 are interlocked with the fourth extensions 1029, 1049 of the second and fourth fixtures 101, 104 located on the sides of the side beam 300 on a common supporting plane. The second free locking device 620 is further defined with mounting hole 622. When the second slots 621 are meshed with the fourth extensions 1029 or 1049, the mounting hole 622 are aligned with the mounting holes 1030 or 1050 of the fourth extensions 1029 or 1049. As a result, with a bolt member (not shown thereof), the second free locking device 620 can be readily interlocked with the second or fourth fixtures 102 or 104.

By the provision of the above described configuration, the fixtures on each supporting plane of the cartridge of the glass substrate can be readily and individually installed and removed. Accordingly, any supporting surface can be installed or removed according to field requirements. In case a glass substrate was damaged or broken on a certain of supporting surface, then the fixtures interlocked thereof can be readily arranged such that the supporting surfaces above the supporting surface in which the glass substrate was broken can be moved to a carrier, and then a cleaning process can be taken on the damaged or broken glass substrate. For example, the large sized broken piece can be removed manually, while the debris or small sized pieces can be vacuumed. Afterward, the glass substrate thereunder can be carefully handled so as to avoid a second damage.

By the provision of the cartridge used for glass substrate, the damaged or defective glass substrate can be readily removed with the novel configurations of the fixtures implemented therein. Specially, no second damages to those intact glass substrate during the handling of the damaged or defective glass substrate.

The above described is merely preferred embodiment of the present invention, and it is merely for illustration while not for limitation. As a result, any alternation and modification or any equivalents based on the specification as well as the drawings will be covered by the attached claims even they are applied to other fields of technology directly or indirectly.

The invention claimed is:

1. A cartridge for carrying glass substrate, comprising:
a pair of side beams each being provided with at least two pillars along a first horizontal direction, each of the pillars being configured with a plurality of fixtures detachably juxtaposed vertically;
a plurality of supporting units arranged between the fixtures of the side beams so as to define a plurality of supporting surfaces in a vertical direction; and
a plurality of free locking units detachably secured to the fixtures of the side beams that are commonly located on a common supporting surface of the plurality of supporting surfaces so as to allow the moving of the fixtures on the common supporting surface as a whole;
wherein each of the fixtures includes a main body, and a first extension extending along the vertical direction from the main body, and a pair of second extensions extending along the vertical direction from the main body, wherein the second extensions are spaced from each other and define a slot therebetween, and are opposite to the first extension, wherein the first extension of an upper fixture can readily and securely retained in the slot defined by two second extensions of a lower fixture; and
wherein each of the fixtures further includes a third extension extending from the main body along a direction perpendicular to the first horizontal direction and the vertical direction and outwardly from the cartridge, and the free locking units include a first free locking device provided with a plurality of first slots which are matched and articulated with the third extensions of the fixtures of the side beams.

2. The cartridge for carrying glass substrate as recited in claim 1, wherein the main bodies of the fixtures are defined with mounting holes for securing the supporting units.

3. The cartridge for carrying glass substrate as recited in claim 1, wherein the third extension has a hook-shaped configuration.

4. The cartridge for carrying glass substrate as recited in claim 3, wherein the hook-shaped configurations of the fixtures located adjacent to a center of each of the side beams are opposite to each other.

5. The cartridge for carrying glass substrate as recited in claim 1, wherein the fixtures located on ends of each of the side beams include a fourth extension that extends along the first horizontal direction and out of the cartridge from the main body, and the free locking units further include a second free locking device that is provided with a pair of second slots along a longitudinal direction thereof, the second slots being engageable with and interlocked with the fourth extensions of the fixtures located on the ends of the side beam.

6. The cartridge for carrying glass substrate as recited in claim 5, wherein the fourth extension is defined with a first mounting hole, and the second free locking device is defined with a second mounting hole aligned with the first mounting hole of the fourth extension.

7. The cartridge for carrying glass substrate as recited in claim 1, wherein the cartridge further includes at least an enhancing device that is vertically arranged between two adjacent ones of the supporting surfaces and is securely coupled between the fixtures of the two adjacent supporting surfaces.

8. The cartridge for carrying glass substrate as recited in claim 7, wherein the enhancing device is configured with a main truss, a plurality of first extensions extending vertically from the main truss and second extensions opposite to the first extension and extending vertically from the main truss, the first extensions of the fixtures being insertable between the second extensions of the main truss of the enhancing device, the first extensions of the enhancing device being insertable in the slots defined between the second extensions of the fixtures.

9. The cartridge for carrying glass substrate as recited in claim 8, wherein the enhancing device further includes a reinforced bar spanned and bridged between the enhancing devices of the pair of side beams.

10. The cartridge for carrying glass substrate as recited in claim 8, wherein the first extension of each of the fixtures is provided with a first mounting hole, and the second extension of the fixture is provided with a second mounting hole, and when the first extension of an upper fixture is juxtaposed with the second extension of the lower fixture, the first mounting hole and the second mounting hole are aligned with each other, and wherein the first extension of the enhancing device is provided with a third mounting hole, and the second extension of the enhancing device is provided with a fourth mounting hole, and when the first extension of the fixture is interlinked with the second extension of the enhancing device, the first mounting hole is aligned with the fourth mounting hole, and when the second extension of the fixture is interlinked with the first extension of the enhancing device, the second mounting hole is aligned with the third mounting hole.

11. A cartridge for carrying glass substrate, comprising:
a pair of first and second side beams arranged opposite to each other, each of the first and second side beams being provided with at least a pair of first and second pillars which is spaced from each other in a first horizontal direction and is configured by detachably stacking a plurality of fixtures in a vertical direction, each of the fixtures defining with mounting hole;
a plurality of supporting units, each of the supporting units attached to two adjacent fixtures of the first and second side beams so as to define a plurality of supporting surfaces; and
at least a free locking device detachably secured to the fixtures that are commonly located on a common supporting surface of the plurality of supporting surfaces such that the fixtures of the common supporting surface are movable as a whole;
wherein each of the fixtures includes a main body, and a first extension extending along the vertical direction from the main body, and a pair of second extensions extending along the vertical direction from the main body, wherein the second extensions are spaced from each other and define a slot therebetween and are opposite to the first extension, wherein the first extension of an upper fixture is readily and securely retained in the slot defined by two second extensions of a lower fixture; and wherein each of the fixtures further includes a third extension extending from the main body along a direction perpendicular to the first horizontal direction and the vertical direction and outwardly from the cartridge, and the free locking unit includes a first free locking device provided with a plurality of first slots which are matched and articulated with the third extensions of the fixtures of the side beams.

12. The cartridge for carrying glass substrate as recited in claim 11, wherein the third extension has a hook-shaped configuration.

13. A cartridge for carrying glass substrate, comprising:
a pair of first and second side beams arranged opposite to each other, each of the first and second side beams being provided with at least a pair of first and second pillars which is spaced from each other in a first horizontal direction and is configured by detachably stacking a plurality of fixtures in a vertical direction;
a plurality of supporting units, each of the supporting units attached to two adjacent fixtures of the first and second side beams so as to define a plurality of supporting surfaces; and
a free locking device detachably secured to the fixtures that are commonly located on a common supporting surface of the plurality of supporting surfaces so as to allow moving the fixtures as a whole; and
at least an enhancing device detachably secured to two adjacent fixtures vertically arranged on two adjacent supporting surfaces;
wherein each of the fixtures includes a main body, and a first extension extending along the vertical direction from the main body, and a pair of second extensions extending along the vertical direction from the main body, wherein the second extensions are spaced from each other and define a slot therebetween and are opposite to the first extension, wherein the first extension of an upper fixture is readily and securely retained in the slot defined by two second extensions of a lower fixture; and
wherein each of the fixtures further includes a third extension extending from the main body along a direction perpendicular to the first horizontal direction and the vertical direction and outwardly from the cartridge, and the free locking unit includes a first free locking device provided with a plurality of first slots which are matched and articulated with the third extensions of the fixtures of the side beams.

14. The cartridge for carrying glass substrate as recited in claim 13, wherein each of the fixtures is defined with a mounting hole to support the supporting unit.

15. A cartridge for carrying glass substrate, comprising:
a pair of side beams each being provided with at least two pillars along a first horizontal direction, each of the pillars being configured with a plurality of fixtures detachably juxtaposed vertically;
a plurality of supporting units arranged between the fixtures of the side beams so as to define a plurality of supporting surfaces in a vertical direction; and
a plurality of free locking units detachably secured to the fixtures of the side beams that are commonly located on a common supporting surface of the plurality of supporting surfaces so as to allow the moving of the fixtures on the common supporting surface as a whole;
wherein the cartridge further includes at least an enhancing device that is vertically arranged between two adjacent ones of the supporting surfaces and is securely coupled between the fixtures of the two adjacent supporting surfaces; and
wherein the enhancing device is configured with a main truss, a plurality of first extensions extending vertically from the main truss and second extensions opposite to the first extension and extending vertically from the main truss, the first extensions of the fixtures being insertable between the second extensions of the main truss of the enhancing device, the first extensions of the enhancing device being insertable in the slots defined between the second extensions of the fixtures.

16. The cartridge for carrying glass substrate as recited in claim 15, wherein the enhancing device further includes a reinforced bar spanned and bridged between the enhancing devices of the pair of side beams.

* * * * *